United States Patent [19]

Masegi et al.

[11] Patent Number: 5,045,835
[45] Date of Patent: Sep. 3, 1991

[54] APPARATUS AND METHOD FOR DETERMINING THE EXISTENCE OF AN ABNOMALITY IN A VEHICLE OPERATOR PROTECTION SYSTEM

[75] Inventors: Mitsuhiko Masegi, Nukata; Masao Sakurai, Oobu; Motoharu Naitou, Okazaki; Akira Kondo, Nagoya; Toshiaki Ota, Anjo, all of Japan

[73] Assignee: Nippondenso Co., Ltd., Kariya, Japan

[21] Appl. No.: 293,412

[22] Filed: Jan. 4, 1989

[30] Foreign Application Priority Data

Apr. 25, 1988 [JP] Japan .................................. 63-101587

[51] Int. Cl.⁵ ............................ B60Q 1/00; B60R 21/32
[52] U.S. Cl. .................................... 340/438; 340/436; 307/10.1; 280/734; 280/735
[58] Field of Search ............... 340/436, 438; 307/10.1; 280/734, 735

[56] References Cited

U.S. PATENT DOCUMENTS

| | | |
|---|---|---|
| 3,629,816 | 12/1971 | Gillund . |
| 4,278,971 | 7/1981 | Yasui et al. ........................ 340/635 |
| 4,835,513 | 5/1989 | McCurdy et al. .................. 340/438 |

Primary Examiner—Donnie L. Crosland
Attorney, Agent, or Firm—Cushman, Darby & Cushman

[57] ABSTRACT

A vehicle operator protection system includes an actuating device, a battery for supplying the actuating device with electric power, and a backup capacitor charged by the battery and supplying power to the actuating device when the battery becomes inoperable. It further includes a switch for cutting off the power supply from the battery and a determining circuit for detecting a discharging condition of the backup capacitor after it has been cut off from the power supply with the switch to determine the existence of an abnormality in the backup capacitor and the actuating device. Through the detection of the discharging condition of the backup capacitor, determination of the existence of an abnormality, based on the intended function of the backup capacitor, can be achieved.

21 Claims, 2 Drawing Sheets

APPARATUS AND METHOD FOR DETERMINING THE EXISTENCE OF AN ABNOMALITY IN A VEHICLE OPERATOR PROTECTION SYSTEM

BACK GROUND OF THE INVENTION

1. Field of the Invention

The present invention relates to a vehicle operator protection system, such as an air bag system and more particularly, to the art of determining the existence of an abnormality in a backup circuit for positively supplying power to the actuating device for actuating the protection system.

2. Description of the Prior Art

In an air bag system or the like, to make sure that the air bag system would be actuated even if the battery of the vehicle becomes inoperable in a collision or the like, it is known to provide a capacitor in parallel with the actuating device of the air bag system so that the capacitor may energize the actuating device with electric charge that had been stored thereon while the battery was operating normally.

U.S. Pat. Nos. 4,278,971 and 3,629,816 disclose measuring the voltage across the backup capacitor while it is supplied with power from the battery and detecting a deterioration in the performance of the backup capacitor based on the charged condition of the backup capacitor.

Specifically, in the '971 patent, the charging process of the backup capacitor is monitored and any decrease in capacitance of the capacitor is determined based on the charging time.

Such prior art systems can detect deterioration either in the performance of the backup capacitor itself or in the charging circuit for charging the backup capacitor.

SUMMARY OF THE INVENTION

The purpose of the backup capacitor is to maintain a voltage sufficient to positively actuate the vehicle operator protection system even when the battery fails or becomes disconnected. Therefore, the length of time that the charge is maintained when power from the battery is cut off and the charging power source is unavailable is important. Nevertheless, the prior art systems only monitor the voltage of the backup capacitor while it is being charged. Hence, it is hard to say whether the prior art system effectively monitors the ability of the backup capacitor to maintain the charge required to actuate the protection system when the backup capacitor is actually needed.

The present invention was made in the view of the above mentioned problem. Accordingly, it is an object of the present invention to provide an apparatus and method for determining the existence of an abnormality in the vehicle operator protection system by obtaining a more direct indication as to whether the originally intended function of the backup capacitor can be performed. This ensures that the vehicle operator protection system will be actuated when power from the battery on the vehicle is cut off.

In order to achieve the above mentioned object, the present invention detects whether the backup capacitor discharges properly when the power from the battery to a parallel circuit of the actuating device and the backup capacitor is cut off under normal conditions. Improper discharging would indicate the existence of an abnormality in the backup capacitor and the actuating device based on the detected discharging condition.

According to the present invention, a backup capacitor is connected in parallel with an actuating device for actuating the vehicle operator protection system parallel circuit and may be supplied with power from a battery through a switch. The backup capacitor is charged while the switch is closed.

When the charged backup capacitor is cut off from the power supply by opening the switch, the backup capacitor starts to discharge through the circuit including the actuating device, thereby dissipating charge.

In the process of discharging, the discharging condition of the backup capacitor is detected and the existence of an abnormality in the discharging circuit including the backup capacitor and the actuating device is determined based on the detected discharging condition.

Since the discharging condition of the backup capacitor, after the power source has been cut off, is detected, it can be determined whether the backup capacitor and the actuating device are properly functioning under a condition similar to that in an emergency, such as when the battery mounted on the vehicle is disconnected.

DETAILED DESCRIPTION OF THE PREFERRED EMBODIMENT

An embodiment of the present invention will be described below with reference to the accompanying drawings.

This embodiment is an application of the present invention to an air bag system mounted on a vehicle. A backup capacitor is connected in parallel with an actuating device including a detonator for actuating the air bag system. After being charged to a voltage by a power source, the capacitor is cut off from the power supply, and thereafter, the period of time during which the voltage on the capacitor changes from a predetermined voltage value to another predetermined voltage value is measured so that the existence of an abnormality in the capacitor and the actuating circuit is determined according to the result of the measurement.

Construction of the present embodiment will first be described below.

Figure 1:
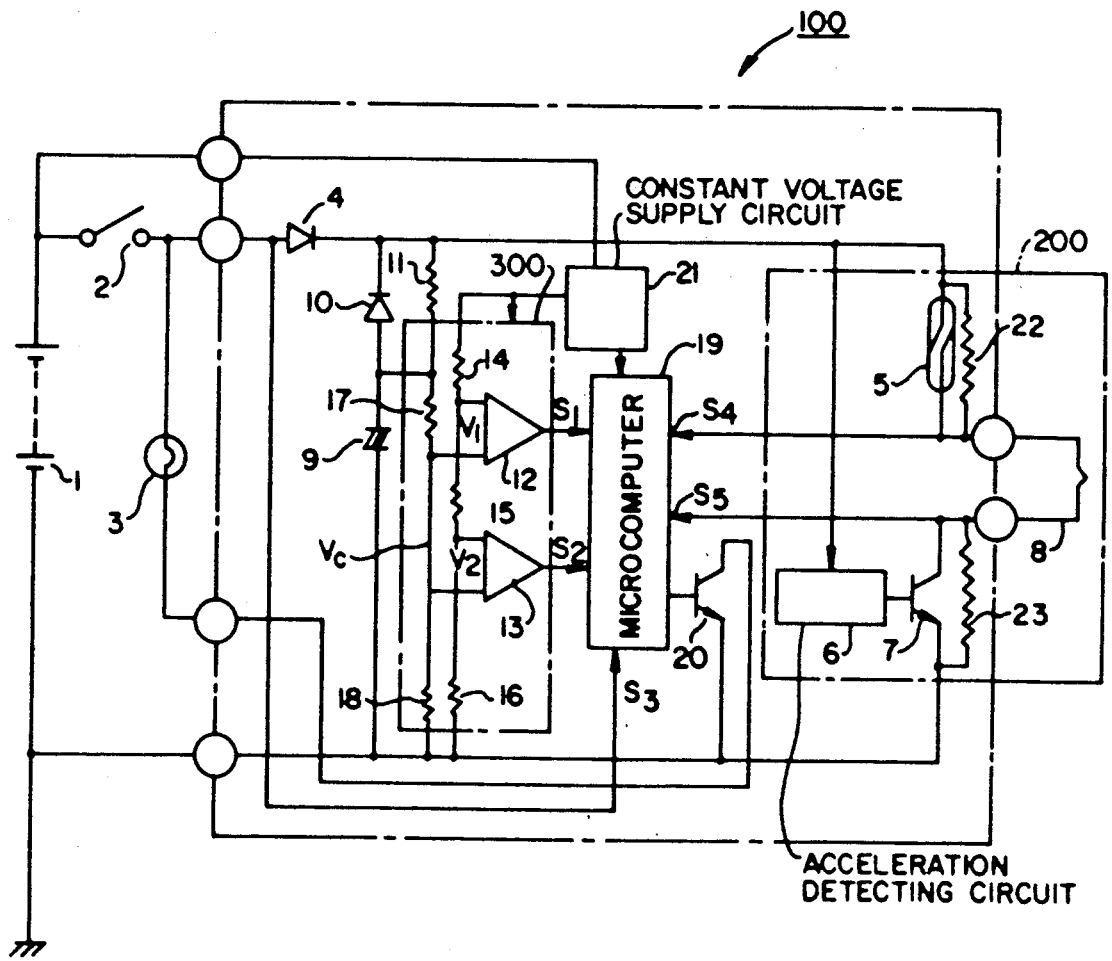
FIG. 1 is a circuit diagram of an embodiment of the present invention.

FIG. 1 is a diagram showing a general arrangement of the present embodiment.

Battery 1, such as a power source mounted on a vehicle, is connected to an ignition switch 2 interlocked with a key switch. An indicator lamp 3 provides an indication of an abnormality in a vehicle operator protection system.

Vehicle operator protection system 100 includes. A diode 4 and a mercury switch 5 configured as a low-G sensor to be closed upon sensing acceleration of a relatively low magnitude but exceeding a predetermined magnitude. A acceleration detecting circuit 6 includes a semiconductor acceleration sensor and is adapted to turn ON a drive transistor 7. Circuit 6 detects a collision of the vehicle when the acceleration sensed by the semiconductor acceleration sensor is above a predetermined value and lasts longer than a predetermined period of time. A squib 8 is configured as an actuator for firing an amount of gunpowder to inflate the air bag. Resistors 22 and 23, of high resistance, allow a weak current to pass through squib 8, which current is sufficiently weak so as not to energize squib 8.

A first circuit 200 is formed of low-G sensing mercury switch 5, acceleration detecting circuit 6, drive transistor 7, squib 8, and resistors 22 and 23.

Backup capacitor 9 and diode 10 are connected across battery 1. Resistors 11, 17 and 18 form a voltage divider across battery 1. Also, constant voltage supply circuit 21 generates reference voltage through a voltage divider network including resistors 14, 15 and 16. The resulting voltages from resistors 11 and 14–18 are applied to comparators 12 and 13 which provides out puts to microcomputer 19. Transistor 20 drives indicator lamp 3.

A voltage detecting circuit 300 is formed of comparators 12 and 13 and resistors 14, 15, 16, 17 and 18.

In the present embodiment firing circuit 200 constitutes the actuating device as referred to in the present invention and voltage detecting circuit 300 and microcomputer 19 constitute the determination means.

Operation of the embodiment of FIG. 1 will now be described.

Microcomputer 19 and voltage detecting circuit 300 are supplied with power from constant-voltage supply circuit 21 regardless of whether ignition switch 2 is opened or closed.

When ignition switch 2 is closed, firing circuit 200 is supplied with power, and at the same time, backup capacitor 9 begins charging through resistor 11.

In the event of a collision while all the circuits are in a normal condition, mercury switch 5 and drive transistor 7 become conductive so that squib 8 is supplied with power from battery 1, causing the air bag to be inflated.

In the event of a failure of battery 1 due to the shock of the collision, some power is supplied from backup capacitor 9 and diode 10 for a certain period of time after the power failure so that the air bag is inflated.

Further, in normal operating conditions, if ignition switch 2 is opened, power from battery 1 to the circuits including backup capacitor 9 and firing circuit 200 is cut off, backup capacitor 9 starts to discharge through resistors 17 and 18 and firing circuit 200 as the discharging paths, and capacitor 9 also dissipates energy itself, causing the charged voltage thereon to fall gradually.

At this time, comparator circuits 12 and 13 are monitoring voltage $V_c$ at the junction of resistors 17 and 18. When voltage $V_c$ falls below a predetermined voltage $V_1$, comparator 12 outputs a detected signal $S_1$. When voltage $V_c$ falls below a predetermined voltage $V_2$, comparator 13 outputs a detected signal $S_2$.

Predetermined voltages $V_1$ and $V_2$ are produced by means of a voltage divider formed of resistors 14, 15 and 16.

In order to stabilize voltages $V_1$ and $V_2$ and detective operations of comparators 12 and 13, the voltage divider 14, 15 and 16 and comparators 12 and 13 are supplied with constant voltages derived from constant-voltage supply circuit 21.

Microcomputer 19 is supplied with detected signals $S_1$ and $S_2$ generated by comparators 12 and 13. It also receives signal $S_3$ indicating opening or closure of ignition switch 2. Based on these signals, microcomputer 19 determines whether the circuit is operating normally or abnormally. When the circuit is determined to be abnormal, microcomputer 19 stores the decision in a memory and also generates a signal to turn ON transistor 20, whereby indicator lamp 3 is lighted when ignition switch 2 is next closed.

Microcomputer 19 is further supplied with signals $S_4$ and $S_5$ representative of the voltages at both ends of squib 8 and thereby detects short-circuiting of squib 8 or short-circuiting of mercury switch 5 and transistor 7 and causes indicator lamp 3 to be lighted in response.

Figure 2:
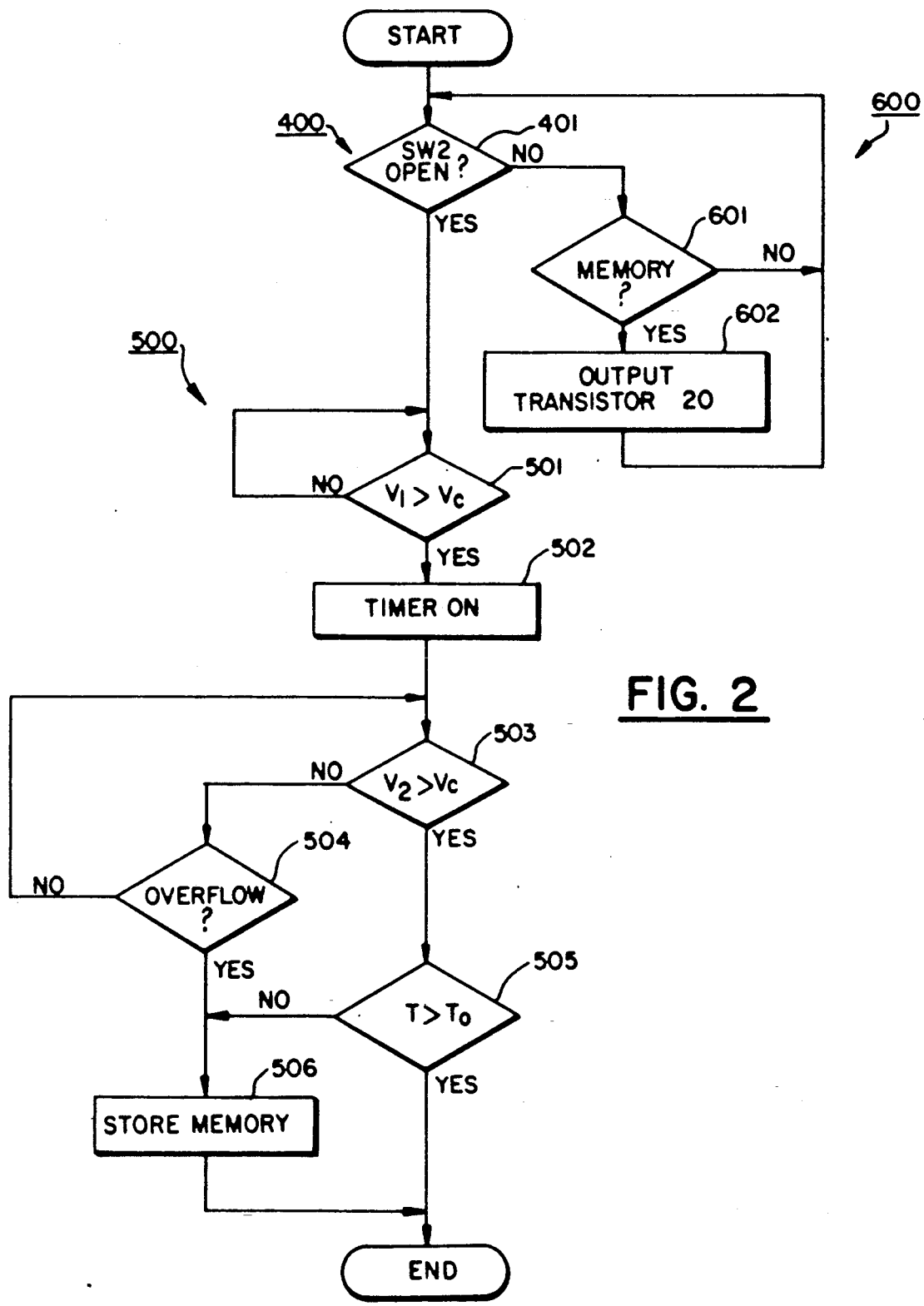
FIG. 2 is a flow chart showing the operation of a microcomputer in the embodiment.

FIG. 2 shows a flow chart depicting the operation of microcomputer 19 relating to determining the existence of an abnormality in backup capacitor 9 and firing circuit 200.

In FIG. 2, routine 500 of the flow chart depicts the operations performed when ignition switch 2 is opened and routine 600 depicts the operations performed when ignition switch 2 is closed.

First, consider the condition when it is detected that ignition switch 2 is opened (turned off) at step 401. Microcomputer 19 checks, at step 501, whether or not voltage $V_c$ has fallen below voltage $V_1$ according to detected., signal $S_1$ generated by comparator 12, and waits until the state $V_1 > V_c$ is reached.

When $V_1 > V_c$ is detected, microcomputer 19 starts a timer, incorporated therein at step 502, to measure the discharging time. The timer counts clock pulses generated within microcomputer 19.

At step 503, microcomputer 19 checks whether or not voltage $V_c$ has fallen below voltage $V_2$ according to detected signal $S_2$ generated by comparator 13. At step 504, it is checked whether or not the timer is overflowed.

Steps 503 and 504 are repeated until the state of $V_2 > V_c$ is reached or the timer overflows.

If $V_2 > V_c$ is detected at step 503, microcomputer 19 at step 505, detects whether or not the time T measured by the timer from when it started its counting at step 502 until the time the branch YES was taken at step 503 is larger than a preset time $T_0$.

The preset time $T_0$ is set to the minimum limit of the discharging time which will indicate that backup capacitor 9 and its discharging path are maintaining normal functions. Since the time required for the voltage on backup capacitor 9 to fall from $V_1$ to $V_2$ is measured by the timer as the time T, if the time T is shorter than the preset time $T_0$, it may be concluded that something abnormal has occurred with backup capacitor 9 or the resistance value of the circuit forming the discharging path for backup capacitor 9 has been lowered by some accident.

If, at step 505, microcomputer 19 finds that $T \leq T_0$, it stores in memory the instruction to light indicator lamp 3 at step 506 and finishes the sequence of operations.

Thus, indicator lamp 3 is lit in the later discussed flow chart routine 600 to thereby inform the vehicle operator of the occurrence of something wrong in the apparatus so that immediate reconditioning measures may be taken.

When the timer is found overflowing at step 504, step 506 is executed similarly. Here, the time for the timer to overflow is set to the maximum limit of the time which will indicate that backup capacitor 9 and its discharging path are maintaining normal functions. Hence, from the overflowing of the timer, it can be determined that something wrong has occurred in backup capacitor 9 or the resistance value of the circuit forming the discharging path has been increased by some accident.

When the discharging time of backup capacitor 9 is abnormally long, microcomputer 19 lights indicator lamp 3 in the later discussed flow chart routine 600 to inform the vehicle operator of occurrence of something wrong in the apparatus so that immediate reconditioning measures may be taken.

If ignition switch 2 is closed again, microcomputer 19 takes the branch NO at step 401 and executes processes according to flow chart routine 600.

It checks at step 601 whether the instruction to light the indicator lamp 3 is stored, and if it is stored in memory, it takes the branch YES.

At step 602, microcomputer 19 outputs a drive signal to transistor 20 so that indicator lamp 3 is lit in response to the stored instruction to light lamp 3.

Thus, the preferred embodiment detects whether or not the discharging time of backup capacitor 9 is larger than one preset period of time and yet has not exceeded another preset period of time. Hence, it positively detects whether something is wrong with in backup capacitor 9 or the circuit forming its discharging path.

The circuit forming the discharging path is the very circuit to which backup capacitor 9 must actually supply power in the event of a failure of the power supply from battery 1. Therefore, it is a significant advantage to monitor the function of the circuit under virtually the same conditions as those in such an emergency.

Since, when an abnormality is detected, the fact is indicated by indicator lamp 3, the vehicle operator, he is immediately informed to recondition the apparatus.

Further, since measurement of the discharging time is made using a timer operating with the clock within microcomputer 19, accurate and stable measurement of the discharging time can be achieved.

It should be noted that the apparatus will detect abnormalities including deterioration with age of backup capacitor 9 and the circuit forming its discharging path, abnormal increases or decreases in resistance values in the circuit, and short- or open-circuiting in the path.

Although, in the present embodiment, indicator lamp 3 is lit when an abnormality is detected, the fact may also be stored in a memory device observable from outside so that whether or not the vehicle operator protection system was in a normally workable state at the time of a collision may be investigated later on.

Although, in the present embodiment, the maximum allowable discharging time is determined when the timer overflows, the decision as to whether the maximum time has elapsed may be obtained by other ways. Also, the measurement of the discharging time is not limited to that between two points of $V_1$ and $V_2$ as described above but the discharging time may be measured at such multiple points as three or four points.

Further, the measurement is not limited to that of the discharging time, but the charged voltage may be measured after a predetermined period of time has past after the cutting off of power from the battery for comparison with preset voltages to determine that something abnormal has occurred in the circuit when the detected voltage is outside the range of the preset voltages.

What is claimed is:

1. Apparatus for determining the existence of an abnormality in a vehicle operator protection system, comprising:
a battery;
an actuating device for actuating the vehicle operator protection system;
a capacitor connected in parallel with said actuating device for supplying power to said actuating device;
means for detecting a discharging condition of said capacitor after said capacitor is normally disconnected from a power source and for determining the existence of an abnormality in said capacitor and said actuating device based on the detected discharging condition; and
means for generating an indication of an abnormality connected to said detecting means.

2. A method for determining the existence of an abnormality in a vehicle operator protection system comprising the steps of:
charging a capacitor connected to an actuating device of the vehicle operator protection system from a power source;
disconnecting said capacitor from said power source to allow said capacitor to begin to discharge at least through said actuating device;
detecting the discharging condition of said capacitor after said capacitor is disconnected from said power source, and
determining the existence of an abnormality in said capacitor and said actuating device based on said detecting step.

3. A method according to claim 2 wherein said detecting step includes the step of monitoring a voltage across said capacitor.

4. A method according to claim 3 wherein said determining step includes the steps of:
measuring a time that said voltage monitored in said monitoring step takes to fall from a first predetermined voltage to a second predetermined voltage; and
generating an indication of an abnormality when said time is less than a predetermined value.

5. A method according to claim 4 wherein said generating step further comprises the step of generating said indication when said time exceeds another predetermined value.

6. A method according to claim 3 wherein said determining step includes the steps of:
measuring a time that said voltage monitored in said monitoring step takes to fall from a first predetermined voltage to a second predetermined voltage; and
generating an indication of an abnormality when said time exceeds a predetermined value.

7. Apparatus for determining the existence of an abnormality in a vehicle operator protection system, comprising:
a battery;
an actuating device connected across said battery, for actuating the vehicle operator protection system;
a capacitor connected across said battery to be charged thereby and disposed in parallel with said actuating device for supplying power to said actuating device with electric charge stored on said capacitor when said battery becomes inoperable;
a switch for cutting off said battery from said actuating device and said capacitor; and
means for detecting a discharging condition of said capacitor after said battery supply has been cut off with said switch and for determining an existence of an abnormality in said capacitor and said actuating device based on the detected discharging condition.

8. Apparatus according to claim 7, wherein said actuating device includes an actuator through which passes a current sufficiently weak so as not to energize said actuating device, whereby signals representative of voltages at both ends of said actuator are provided, and wherein said detecting means detects open-circuiting in said actuating device based on said signals.

9. Apparatus according to claim 7 wherein said detecting means comprises means for monitoring a voltage across said capacitor.

10. Apparatus according to claim 9 wherein said detecting means includes means for:
measuring a time that said voltage monitored by said monitoring means takes to fall from a first predetermined voltage to a second predetermined voltage; and
generating an indication of an abnormality when said time is less than a predetermined value.

11. Apparatus according to claim 10 wherein said measuring and generating means performs said generating function by also generating said indication of the abnormality when said time exceeds another predetermined value.

12. Apparatus according to claim 9 wherein said detecting means includes means for:
measuring a time that said voltage monitored by said monitoring means takes to fall from a first predetermined voltage to a second predetermined voltage; and
generating an indication of an abnormality when said time is greater than a predetermined value.

13. Apparatus as in claim 7 further comprising means for generating an indication of an abnormality connected to said switch and said detecting means, said generating means generating said indication when said switch is closed.

14. Apparatus according to claim 7 wherein said switch comprises an ignition switch.

15. Apparatus according to claim 14, further comprising memory means for memorizing data indicative of said existence of said abnormality.

16. Apparatus according to claim 15, further comprising informing means for informing a passenger in said vehicle of said existence of said abnormality, in response to a closing operation of said ignition switch.

17. Apparatus as in claim 16, wherein said informing means comprises an indicator lamp.

18. Apparatus for determining the existence of an abnormality in a vehicle operator protection system, comprising:
a battery mounted on a vehicle;
actuating means connected across said battery, for actuating said vehicle operator protection system;
a capacitor connected across said battery to be charged thereby and disposed in parallel with said actuating means for supplying power to said actuating means with electric charge stored on said capacitor when said battery becomes inoperable;
switch means for cutting of said battery from said actuating means and said capacitor;
discharge path means, in response to said battery being cut off by said switch means, for causing said capacitor to discharge and producing a discharge voltage which gradually falls in accordance with the discharge of said capacitor;
first detecting means for detecting a first condition that said discharge voltage has reached a first predetermined value;
second detecting means for detecting a second condition that said discharge voltage has reached a second predetermined value which is lower than said first predetermined value; and
means for measuring a time elapsed from said first condition detected by said fist detecting mans and said second condition detected by said second detecting means and for determining an abnormality of said capacitor when said time is out of a range which corresponds to a normal condition of said capacitor.

19. Apparatus according to claim 18 wherein said switch means comprises an ignition switch.

20. Apparatus according to claim 19, further comprising memory means for memorizing data indicative of said abnormality of said capacitor.

21. Apparatus according to claim 20, further comprising informing means for informing a passenger in aid vehicle of said abnormality, in response to a closing operation of said ignition switch.

* * * * *